United States Patent [19]
Chen

[11] Patent Number: 6,025,618
[45] Date of Patent: Feb. 15, 2000

[54] TWO-PARTS FERROELECTRIC RAM

[76] Inventor: Zhi Quan Chen, 5N, Hibber Apt., Faculty Rd., Princeton, N.J. 08540

[21] Appl. No.: 08/747,522

[22] Filed: Nov. 12, 1996

[51] Int. Cl.[7] .................................................. H01L 23/48
[52] U.S. Cl. .......................... 257/295; 257/778; 257/785; 257/686; 257/688; 257/689; 29/830; 29/831; 361/735; 361/789; 361/790; 365/145; 365/164; 365/177; 365/65; 438/108; 438/109
[58] Field of Search .................................... 257/778, 785, 257/686, 688, 689, 295; 438/108, 109; 29/830, 831; 361/735, 790, 789; 365/177, 145, 164, 65

[56] References Cited

U.S. PATENT DOCUMENTS

| | | | |
|---|---|---|---|
| 4,157,932 | 6/1979 | Hirata | 156/310 |
| 5,121,190 | 6/1992 | Hsiao et al. | 357/80 |
| 5,196,371 | 3/1993 | Kulesza et al. | 437/183 |
| 5,384,952 | 1/1995 | Matsui | 29/840 |
| 5,397,245 | 3/1995 | Roebuck et al. | 439/264 |
| 5,523,628 | 6/1996 | Williams et al. | 257/777 |
| 5,672,980 | 9/1997 | Charlton et al. | 324/755 |
| 5,686,745 | 11/1997 | Lin et al. | 257/295 |
| 5,739,053 | 4/1998 | Kawakita et al. | 438/108 |
| 5,753,536 | 5/1998 | Sugiyama et al. | 438/108 |
| 5,889,299 | 3/1999 | Abe et al. | 257/295 |

*Primary Examiner*—William Mentel

[57] ABSTRACT

A method of fabricating a complex IC in two parts and making the electrical connections between them afterwards is described. By this method, a ferroelectric RAM is fabricated in two parts, where the first part has an array of unit cells each of those has a transistor or a group of transistors serving the purpose of selecting one address for data recording and has an array of electrically conductive pads facing upward, protruding out from the surface of the first part, where the second part consists of a data-recording layer on another substrate. The data-recording layer consists of ferroelectric material and is pressed on the first part during data writing and reading.

7 Claims, 2 Drawing Sheets

6,025,618

TWO-PARTS FERROELECTRIC RAM

FIELD OF INVENTION

This invention relates to a kind of ferroelectric memory IC device that is fabricated separately in two parts that are electrically interconnected afterwards.

BACKGROUND OF THE INVENTION

Non-Volatile RAM (NVRAM) is a very useful device, because the data recorded in it will not disappear even without power. At present, the [only available] most promising NVRAM is the ferroelectric one. Other nonvolatile memory devices are not truly randomly accessible for writing, reading and rewriting. In principle, the ferroelectric NVRAM is essentially a DRAM whose capacitors use ferroelectric material as insulator. The data recording unit cell of most conventional DRAM consists of an MOSFET and a capacitor. Data are recorded as charge stored in the capacitor while the MOSFET serves as an address selector. Because of discharge through inevitable leakage, charge stored in the capacitor will disappear after a certain time. So, DRAM is a volatile memory device. However, if we replace the capacitor in the unit cell of the DRAM by a special capacitor with ferro-electric film as insulator, we will get a nonvolatile RAM. In this case, data are recorded not as charge in the capacitor, but as polarization in the ferroelectric layer. Depending on the direction of the electric field applied across it, the ferroelectric layer can have two direction of polarization. We can use one direction to represent the digit "1", the other direction "0". For ferroelectric material, the polarization will not disappear when we turn off the applied field. This is the foundation of the data nonvolatility of ferroelectric RAM.

Nowadays ferroelectric NVRAM has a fatigue problem that hinders its use. The remnant polarization of the ferroelectric material will diminish after many reversals of the direction of polarization, leading ultimately to practically indistinguishability of two states of data record. Research showed this problem arises from the oxygen vacancies or other defects within the ferroelectric material, such as PZT. A high temperature annealing can eliminate these defects and alleviate the fatigue problem. However, if the ferroelectric capacitors and the MOSFETs are fabricated on a same substrate, annealing at higher than 550 degree centigrade will have adverse effects (such as unwanted diffusion of the contact metal into the silicon and excessive diffusion of the dopants) on the MOS structure. (See the article "Progress in Ferroelectric Memory Technology," by William A. Geideman of McDonnell Douglas Electronic Systems Company, IEEE Trans. on Ultrasonic, Ferroelectrics and frequency Control, 38, p. 704–711, (1991).) Unfortunately, annealing temperature higher than 600° C. are desired for annealing PZT.

If we fabricate the ferroelectric capacitors on another substrate, not on the substrate with MOSFETs, then we can anneal the ferroelectric material at temperature higher than 600° C., without any adverse effect on the MOS structure. This is one advantage of fabricating the NVRAM in two parts.

Many other ferro-electric materials are not compatible with the MOS technology. If the ferroelectric capacitors are fabricated on another substrate, then we can avoid such incompatibility and have a wider choice of ferroelectric materials. This is another advantage of fabricating the device in two parts.

In summary, fabricating the whole NVRAM in two parts facilitates its manufacture, provides more choices of materials and fabrication methods. Moreover, the total yield may be higher because either part is made with fewer steps and in simpler construction. The data recording part is especially simple in construction. It can be manufactured in large quantity at low cost.

Since the invention of IC, more and more devices are being put into a single chip. Because different devices require different processing procedures, the whole processing procedure is getting more and more complex. The yield is getting lower and lower and the cost higher and higher. Fabricating a complex IC in two parts is a new way that breaks away from the above trend and will lead to a new area of IC manufacturing.

Of course, after fabricating the whole device in two parts, we should make the required electrical connections between them. We will explain how to solve this key issue later on.

SUMMARY OF THE PRESENT INVENTION

The present invention consists of putting all the ferroelectric capacitors of the ferroelectric NVRAM on an other separate substrate. This separate substrate with the capacitors on it forms the record medium part while the substrate with all the MOSFETs on it forms the circuitry part. These two parts can be fabricated separately. After the fabrication of these two parts, the record medium part can be connected permanently or temporary, with the circuitry part, forming a whole NVRAM. By fabricating these two parts separately, we can optimize the performances of either part, without any adverse effects on the other part, thus obtaining a good non-volatile RAM. This is one objective of the present invention. The method of fabricating a complex IC in two parts and electrically connecting these two parts afterwards has some usefulness and is also one of our objectives. How to achieve these and other objectives of the present invention would be clear after examining the embodiments of our invention as set forth in the following specification.

BRIEF DESCRIPTION OF THE DRAWING

Specifically.

DESCRIPTION OF THE PREFERRED EMBODIMENTS

Figure 1:
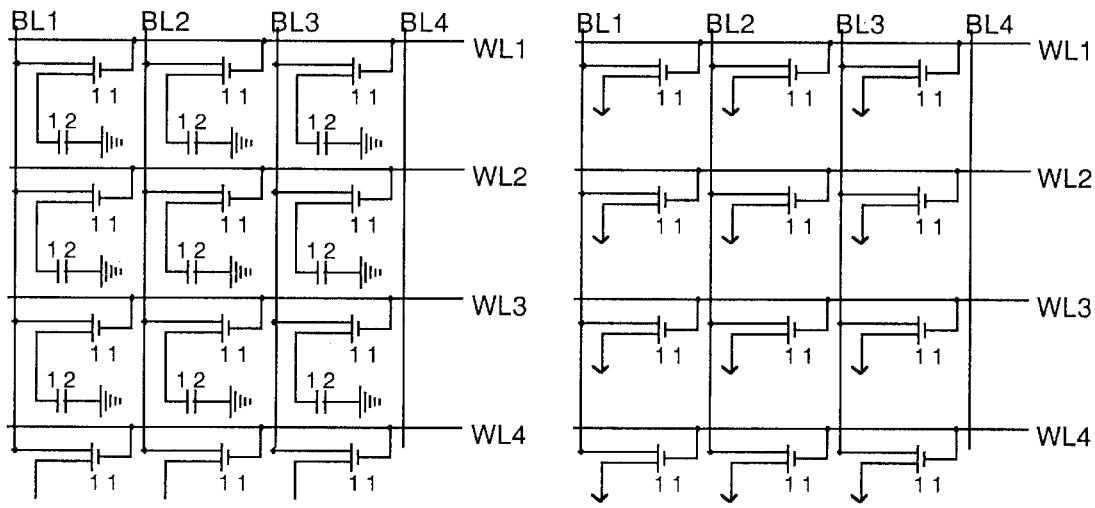
FIG. 1 is a schematic view of a part of an array of memory unit cells in a DRAM.

FIG. 1 is a schematic view of a part of an array of memory unit cells in a DRAM. One unit memory cell consists of an MOSFET 11 and a capacitor 12. The gate electrode of the MOS is connected to a word line(WL) and the drain electrode connected to a bit line(BL). One plate of the capacitor is connected to the source electrode of the MOSFET and the other plate to common ground. By disconnecting the capacitors from the source electrodes of the MOSs and using ferroelectric material as the insulator of the capacitors, we can separate FIG. 1 into two parts, FIG. 1A and FIG. 1B.

Figure 1A:
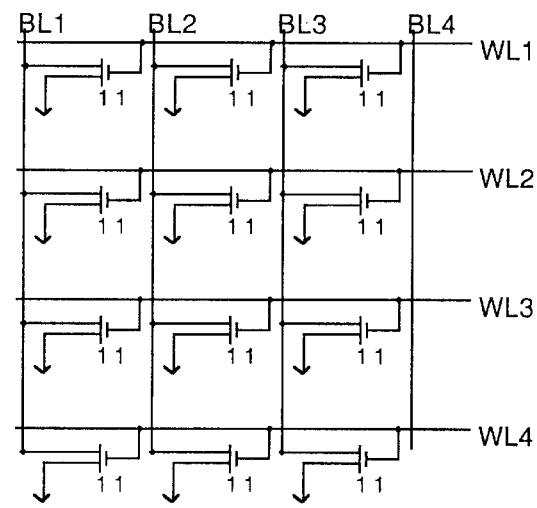
FIG. 1A and FIG. 1B are similar schematic views representing the two separate parts of the present invention.
Figure 1B:
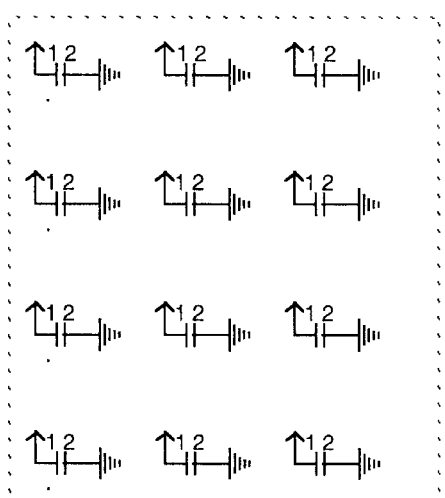

FIG. 1A represents the circuitry part with all the MOSFETs on it while FIG. 1B represents the record medium part consisting of all capacitors manufactured on another substrate. The lower plates of the capacitors connect together, forming a common conductive plate. The upper plates of these capacitors face up on the surface of the substrate. The source electrodes in FIG. 1A also face up on the surface.

Figure 1C:
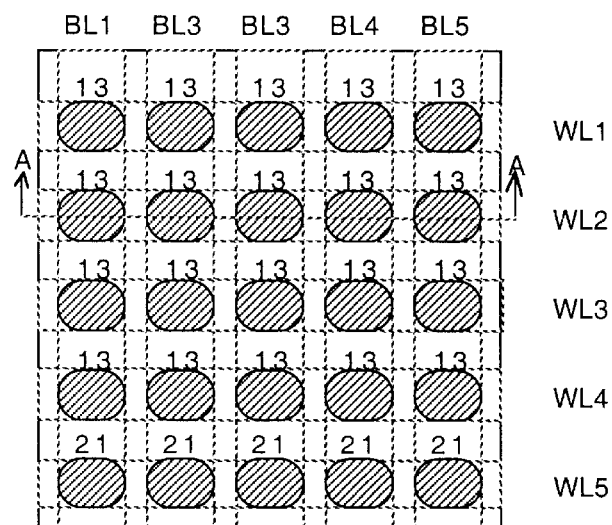
FIG. 1C is a top view of the circuitry part of one embodiment of the present invention.
Figure 1D:
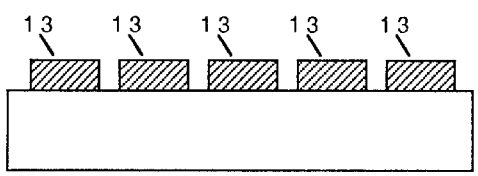
FIG. 1D is the sectional view of the circuitry part, taken along AA.
Figure 1E:
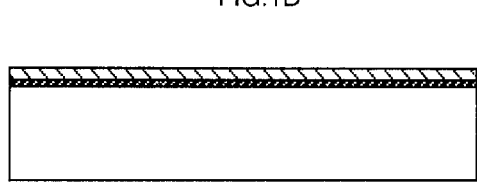
FIG. 1E is the sectional view of the record medium part.
Figure 1F:
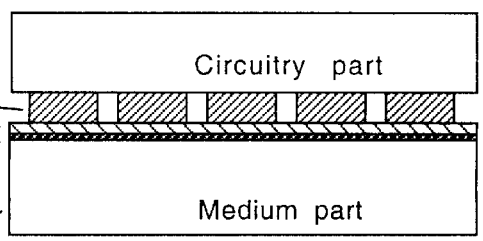
FIG. 1F shows how the record medium part is connected to the circuitry part.

The top view of the circuitry part is shown in FIG. 1C, where the symbol 13 represents a conductive pad protruding out from one of the drain electrodes of the MOSFET's. There are many such conductive pads arranged in a two-dimensional array. Each pad situates on the intersection of a bit line and a word line. These pads are made by specific methods to be explained later. Detailed circuitry of the circuitry part is the same as that published with relation to the ferroelectric RAM and is not shown here. FIG. 1D shows the sectional view of the circuitry part, taken along the line AA in FIG. 1C. The sectional view of the record medium part is shown in FIG. 1E, where the symbol 14 represents the substrate, 15 a metal layer forming the common lower plates of all capacitors and 16 a layer of ferroelectric material.

There are two methods of connecting the record medium part with the circuitry part, temporary and permanently connection method. By the permanent connection method, these two parts are connected permanently and packaged together, after the fabrication. By the temporary connection method, the record medium part will be aligned and pressed on the circuitry part during data writing or reading and can be separated from the circuitry part when not in use. The construction of the record medium part is very simple. It can be obtained by depositing consecutively a metal layer, a ferroelectric layer on a smooth substrate. Such record medium part can be easily manufactured in a large quantity. In the case of temporary connection, this record medium part is removable, inserting into the computer while in use and taking out for reservation when not in use. It has the same convenience as the floppy disk.

Electrically Connecting the Circuitry Part and the Record Medium Part

It is not easy to connect well all the conductive pads on the circuitry part with the record medium part. To ensure good mechanical contact and electrical connection, the surface of the protruding conductive pads should lie on a plane, within a few tenths of a micrometer. This requirement may be achievable, by having the substrate well polished and having all subsequent fabrication procedures controlled to submicron precision.

However, in spite of careful processing, there will still be some variation in height of the surface of both the circuitry part and the record medium part. If the conductive pads are made of hard material, it will happen that only a few taller ones of these pads will contact well with the record medium part, while the shorter ones will not contact. To guarantee all pads contact well, the taller pads should yield a little on being pressed, allowing the shorter pads come to contact. Therefore these pads should be made of material that can yield on being pressed. For repeatable use, as in the case of removable record medium part to be explained later, these pads should be made of elastic material and its elastic range should be larger than the variation in height of the surfaces as mentioned above. Of course, any of the elastic pads should not cause a high contact resistance; it should be made of conductive elastic material. (Because the ferroelectric material is electrically insulate, there will be no D.C. current actually passing through it. Therefore, what we really require is that the elastic pads can transfer electrical charges to and from the surface of the pad touching the record medium part. Moreover, there is no need for these pads to bond with the record medium part. Only closely contact between the pads and the record medium part is enough. Even a very small gap between the pads and the record medium part can be allowed, so far as the capacitance between the pad and the common ground remains nearly constant.)

Conductive Elastic Materials

There are some conductive elastic materials that can meet the above mentioned requirements. One kind of conductive elastic material is the metal particles filled elastomers. There are metal particles filled elastomers in the market. However, the metal particles in the present commercially available metal particle filled elastomers are simply too coarse, about the size of a few micrometers. This prevents such material to be used in our case. (There are flip chip bonding methods using such coarse-grained polymers too. For example, that patented by the Epoxy Technology Inc. Billerica, Mass. (see: U.S. Pat. No. 5,237,130 "Flip chip technology using electrically conductive polymer and dielectric".) Pads of such polymers are of width of about 50 micrometers. Why the width of pads is so large? Because there is a certain difference between the etching rate of the metal particle and the etching rate of the matrix, some irregularities on the pads' boundary will be produced by etching. In order that the boundary of the pads will not be too rough, the size of the pads should be at least one order of magnitude larger than the size of the metal particles. Therefore, elastomers filled with metal particles of size of the order of a micrometer are inadequate for our purpose. The width of the pads considered here will less than 5 micrometers. In the case of higher density, the width of these pads should be even smaller. In our consideration, the size of the metal particle, or the particle of conductive materials, should be much less than one micrometer. Otherwise, we can not obtain smooth boundary of the pads.

One method of obtaining fine-grained metal particles filled elastomer that meets our requirement is plasma polymerization and simultaneous metal vapor deposition. The metal particles filled elastomer thus obtained can have a resistivity as low as $10^{-5}$ ohm-cm and metal particles of the size less than 0.2 micrometers. (See: "Microstructure and electrical conductivity of plasma deposited gold/ fluorocarbon composite film." by J. Perrin et al., J. Vac. Sci. Tech. A 4(1) January/February 1986).

In this method, we can use HMDS (hexamethyldisilazen), a monomer of silicone as the starting material in the plasma polymerization (See: "Deposition, structure and properties of plasma polymer metal composite films" by A. Heilmann and C. Hamann, Progr. Colloid Polym. Sci. Tech. 85 (1990) pp. 102–110.). HMDS vapor is introduced into a vacuum system, through a monitored flow meter. The substrate to be deposited is placed within the RF glow plasma region. Plasma polymerization will occur and a layer of polymerized silicone will be deposited on the substrate. If, metallic gold (or silver or other metal) is evaporated simultaneously with the plasma polymerization of the HMDS going on, a composite film of a fine-grained metal particle filled silicone elastomer will result.

Besides silicone elastomer, we can use halocarbon elastomers also ( See: "Microstructure and optical properties of gold doped plasma polymerized halocarbons" by A. Fejfar, L. Martinu and I Ostadal, Vacuum, Vol 39, p. 19, 1989 and "Microstructure and electrical conductivity of plasma deposited gold/fluorocarbon composite films", by J. Perrin, B. Despax, V. Hanchett and E. Kay, J. Vac Sci Technol. A 4(1) p. 47, 1986)

Another kind of conductive elastic material is certain (conjugate polymer)/elastomer blends. Certain conjugate polymers have very high electrical conductance. For example the resistivity of polyacetylene can be as low as $10^{-3}$ ohm-cm. There are other conjugate polymers such as polyaniline, polypyrrole etc., having less but still very high conductance. An elastic and conductive film can be obtained from the blends of these conjugate polymers (for example, polyaniline) with elastomers. The content of the conjugate polymer in the blends can be very low, as low as less than 10%, so that the elastomer matrix dominates the mechanical property of the blend. That is to say, the resulting blend is elastic. The size of the conductive conjugate polymer particles can be less than 20 nanometers, so that smooth boundary of micron sized pads can be obtained. (See for example: "Conducting Polyaniline Nanoparticle Blends with Extremely Low Percolation Thresholds" by Pallab Banerjee and Broja M. Mandal, Macromolecules 1995, 28, pp. 3949–3943.)

General methods of obtaining (conjugate polymer)/polymer blends have been developed recently. If we choose (n elastomer for blending with the conjugate polymer, then we get a (conductive conjugate polymer)/elastomer blend. There are many examples of such blends so far realized. One example is polypyrrole/(silicone rubber) blend, which is a good conductive elastomer ("Dielectric properties of conducting polymer composites at microwave frequencies" by V. T. Truong et al., Journal of Material Science 29, 1994, pp. 4331–4338). Another is polyaniline/poly(vinyl chloride) blend, which has been studied by several scientists and is commercially available (produced by Zipperling Company of Germany, under the trade name INCOBLEND) and have been employed in making antistatic footwear. (See: "Application of intrinsically conductive polymers for antistatic footwear", by McCall C. et. al. Annual Technical Conference-ANTEC, Conference Proceedings vol 2, 1995, Soc. of plastic Engineers, p. 1347) Polyvinylchloride is in fact a thermoplastic material. However, it has elasticity and adding certain plasticizers can vary its elasticity.

Among the methods of obtaining (conjugate polymer)/polymer blends, the method initiated by Dr. Alan J. Heeger ET. al. is particularly suitable for our purpose. (See: "Counter-ion induced processibility of conducting polyaniline and of conducting polyblends of polyaniline in bulk polymers." by Young Cao, Paul Smith and Alan J. Heeger. Synthetic Metals, vol 48 (1992) pp. 91–97. "Counter-ion induced processibility of conducting polyaniline", by Young Cao, Paul Smith and Alan J, Heeger; Synthetic Metals, 55–57 (1993) 3514–3519.) In this method, polyaniline is protonated ("protonate" means "attach a proton to") with some counter-ion material such as, camphorsulfonic acid or dodecylbenzenesulfonic acid. The polyaniline becomes highly conductive after the protonation. Moreover, because of the long organic tail of the sulfonic acids, the polyaniline complex becomes soluble in many organic solvents (such as, cresols, xylene, chloroform, formic acid, DMSO etc.). Some elastomers are also soluble in one of these solvents. If we mix a solution of such polyaniline with a solution of an elastomer in the same solvent, we can get a good polyaniline/elastomer blend after the solvent is evaporated. By this way, a polyaniline/(ABS rubber) blend as well as other polyaniline polymer blends have been obtained by Alan J. Heeger et al. (See the references by these authors mentioned above). This method has been extended to conjugate polymer other than polyaniline too. (See: "Counter-ion induced processibility of conjugate polyquinolines", by M. C. M. van der Sander, C. Y. Yang, Paul Smith, A. J. Heeger; Synthetic metals, vol 78, (1996) pp. 47–50.)

After mixing a solution of polyaniline with a solution of an elastomer in the same solvent, we can coat (dip coat or spin coat) the mixed solution on the surface of the circuitry part. After the evaporation of the solvent, we can get a layer of conductive elastic material.

After the formation of this layer, photolithography and RIE (Reactive Ion Etching) techniques may be employed to pattern it into an array of pads. This patterning method works for the plasma polymerized metal particle filled material as well as the (conjugate polymer)/elastomer blend. (For effective etching of the organic layer, oxygen should be present as a member of the reactive ions and silicone-containing photoresist should be employed for masking the to-be-protected region of the pattern.)

We can even choose the elastomer to be a photosensitive one also. In this case, only one photolithography step can be employed to obtain the conductive elastic pads. Using a lithography mask for protection and putting the above obtained layer under the UV light, that part of the photosensitive elastomer exposed to UV light will cross-link and become insoluble in certain solvent, while the unexposed portion will remain soluble and can be removed in the development step. Thus, a desired pattern can be obtained without using RIE.

A Tape-Shaped Recording Medium

Figure 3:
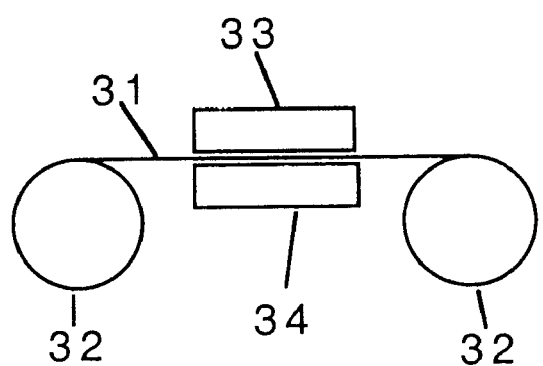
In FIG.3, an embodiment using tape shaped record medium part is shown.

The substrate of the record medium part can be made of flexible material and in the form of a tape, using polymer ferroelectric material or ferroelectric particle filled polymer material. In FIG. 3, such a tape 31 is shown being wound on two reels 32. A portion of the tape 31 between these two reels 32 is sandwiched between the circuitry part 33 and a counter plate 34. This portion of tape forms the record medium part. Monitoring the rolling of the reels is needed in this case, to select the portion of the tape for writing/reading. The selected portion of the tape would be pinched tightly by the circuitry part 33 and the flat plate 34 for assuring the electrical connection between the circuitry part and the medium part. In this way, a large volume of data can be selected, written or read out. Of course, its access time will be long because of mechanical motion needed. Nevertheless, once the right portion of storage area is accessed, the transfer (reading or writing) rate of data in this area is as fast as the usual DRAM, far faster than that of magnetic disk. For cleanness sake, the reels, the tape, the circuitry part and the counter plate can be enclosed in a sealed cartridge.

In the above description, the record medium part will be made of soft (mechanically yieldable) material, so that even if the electrically conductive pads on the circuitry part are mechanically hard, good electrical connections for all the pads can still be obtained.

Permanent Connection Method

For the permanent connection method, the material for making the conductive pads may be other than elastomer. Any material that can yield on being pressed will serve our purpose. These materials include but are not limited to: soft metals such as gold or indium; plastics or thermoplastic material filled with fine grained metal particles or conductive polymers; low melting metal that will melt at a not too high temperature, etc.

The elastic conductive pads can also be used for permanent connection. What it needs is joining the two parts together permanently by some other means (such as using adhesives). Another permanent connection method is soldering. In this method, two arrays of metal pads are deposited on the surfaces of the circuitry part and the record medium part. The geometry of these two arrays is designed such that each pad of an array will fall on top of a pad of the other array. These two arrays of pads are made of different metals, which have a eutectic point lower than the melt points of the two pure metals. By keeping these two parts at a temperature below the two melt points and above the eutectic point and pressing the two arrays of pads against each other, we can solder these two arrays of pads very well. When two taller pads contact, a small amount of metals on the contact point will interdiffuse, form eutectic and melt. The melted portion of metal on the taller pads can yield on compression, allowing shorter pads to contact. By choosing adequate metals, a eutectic point below 300° C. is realizable and heating up to such temperature will do no harm to both parts.

The above-described soldering connection method requires registration between two arrays of pads. There is another method of permanent connection that requires no registration. In this case there is no conductive pad on the medium part, only one array of conductive pads, on the circuitry part. These pads are made of low melting point metal or alloy, such as tin, indium, their alloy with lead or the like. The record medium part is pressed on the circuitry part at a temperature a little above the melting point of the conductive pads on the circuitry part, so that the taller pads will yield, allowing the shorter pads to contact well with the record medium part. In this case, no soldering happens and some means (such as using adhesives) should be employed to keep the two parts together.

In the above description, we assume that the ferrolectric layer is made of hard materials. In fact, there are soft ferroelectric materials also. One kind is the ferroelectric plastic. This has not had the required properties for a good recording medium yet. Another kind of soft ferroelectric material is PZT particles embedded in a plastic matrix, just as magnetic particles embedded in a plastic matrix, in a magnetic tape. With such soft ferroelectric material as the recording medium layer on the record medium part, we can just press a circuitry part on it to make the electrical connection, provided the source electrodes on the circuitry part are exposing outward, or better still, extruding out of the surface a little.

In order to enable those skilled persons in the art to understand fully the present invention, the following examples are presented. It should however be noted that the present invention is not limited to these examples.

EXAMPLE 1
(For Temporary as Well as Permanent Connection)

The record medium part consists of a substrate, a metal layer and then a ferroelectric layer deposited on top of the substrate. There is no metal film on top of the ferroelectric layer of the record medium part. On the other hand, there is an array of elastic conductive pads on top of the circuitry part. Each pad connects to the source electrode of the MOS transistor of each cell (data recording unit). These elastic conductive pads are made of polyaniline/elastomer blend as follows. Emeraldine base form of polyaniline(PANI) is mixed with dodecylbenzenesulfonic acid (DBSA), in molar ratio of DBSA to PANI unit=1.0, using an agate mortar and pestle in nitrogen atmosphere. An appropriate quantity of the resulting mixture is placed into xylene, treated in an ultrasonic bath for 48 hours at 50° C. The PANI-DBSA complex dissolves to give a viscous deep green solution. This PANI-DBSA complex is chosen as the conductive conjugate polymer. As the elastomer, we choose polyisoprene (synthetic rubber), which is soluble in xylene also. With the addition of 1% to 5% of 2,6-Bis(4-azidobenzylidene)4-methylcyclo-hexanone, we can make the polyisoprene sensitive to UV (Ultra Violet) light. Before exposure to light, the sensitized polyisoprene is soluble in xylene. After exposure, it gets crosslinked and becomes insoluble, in xylene. We can mix a solution of polyaniline in xylene with a solution of such sensitized polyisoprene in xylene, keeping the proportion of polyaniline to polyisoprene near 15%. Sin-coat or coat by other means such mixed solution on the surface of the circuitry part. By adjusting the concentration of xylene, we can modulate the viscosity of the mix solution. By adjusting this viscosity and the spinning speed, we can obtain an adequate thickness of the spin-coated layer, as we desired. After evaporation of the solvent xylene, a layer of polyblend will be obtained. With a lithography mask, this layer is put under UV light. The unexposed (masked) portion of the layer remains soluble in xylene while the exposed (unmasked) portion becomes insoluble, in xylene. In a development step, xylene can be used to remove the unexposed portion, leaving the exposed portion (by design, which should be an array of pads) intact. The result is an array of conductive elastic pads, as we desired. These pads are composed of a crosslinked polyisoprene matrix with an embedded continuous framework of conductive polyaniline.

Certain means should be provided to keep the circuitry part and the record medium part on pressing against each other. For permanent connection, such means could be joining by adhesive or soldering, at places outside of the conductive elastic pads, or encapsulating both parts in a container. For temporary connection, such means should be holding the two parts separately and monitoring their relative position with some mechanical actuator.

EXAMPLE 2
(For Temporary as Well as Permanent Connection)

Same as example 1, except that the photosensitivity of the polyisoprene is utilized for the curing (crosslinking) of the whole layer, not for photolithography. After the spin coating and the evaporation of the xylene, as in example 1, the whole layer (with no mask) is exposed in UV light for curing. After curing, an additional photolithography step is carried out to pattern the layer into an array of pads. For this a silicone containing photoresist layer should be applied on top of the polyaniline/elastomer blend layer. By means of photolithography and an additional RIE (Reaction Ion Etch) step, we can pattern the polyaniline/elastomer layer into an array of pads as we desired. With the advantage of RIE, we can get better profile of the pads, on the cost of an additional fabrication step.

EXAMPLE 3
(For Temporary as Well as Permanent Connection)

Similar to example 2, except the polyisoprene not necessarily be photosensitive. No sensitizer (such as 2,6-Bis(4-azidobenzylidene)4-methylcyclo-hexanone) will be added. Heat curing is employed in place of UV light curing.

EXAMPLE 4
(For Temporary as Well as Permanent Connection)

For the conductive conjugate polymer, we can choose polyaniline protonated with camphorsulfonic acid. Emeraldine base form of polyaniline (PANI) is mixed with camphorsulfonic acid (CSA), in molar ratio of CSA to polyaniline unit=0.5, using an agate mortar and pestle in nitrogen atmosphere. An appropriate quantity of the resulting mixture is placed into m-cresol, treated in an ultrasonic bath for 48 hours at 50° C. The PANI complex dissolves to give a viscous deep green solution. This PANI-CSA complex is chosen as the conductive conjugate polymer. For the elastomer, we can choose the one part blocked polyurethane (such as the ®Mondur, produced by the Miles Chemical Corp. Pittsburgh, Pa. 15205). Both these two components are soluble in m-cresol. Solution of these two components in m-cresol, with PANI-CSA to polyurethane ratio about 1:10, is mixed and spin-coated on the surface of the circuitry part. After evaporation of the solvent m-cresol, the resulting layer is heat treated at a temperature of 100–200° C., to have the polyurethane crosslinked. In this case, an additional photolithography step is needed to pattern the layer into an array of pads. A silicone containing photoresist layer should be applied on top of the polyaniline/elastomer blend layer. By means of photolithography and an additional RIE (Reaction Ion Etch) step, we can pattern the polyaniline/elastomer layer into an array of pads, as we desired. From this case, we can see that a wide range of elastomers, not necessarily limited to photosensitive ones can be employed.

EXAMPLE 5
(For Temporary as Well as Permanent Connection)

Similar to above examples, except the polyaniline/elastomer blend layer is replaced by a metal particle filled plasma polymerized elastomer layer, fabricated by the method described in the third paragraph on page 4.

For example, a plasma discharge is generated in a perfluoropropane ($C_3F_8$)-argon gas mixture, by means of a capacity coupled diode system in which one electrode is grounded. The 13.56 Mhz RF power is coupled to the other electrode covered with gold, which is to be incorporated in the film. Gold is deposited on the substrate, which lies on the grounded electrode, by sputtering. Fluorocarbon elastomer layer is plasma deposited on the substrate at the same time, by plasma polymerization. After adequate thickness of the film is obtained, a patterning method is employed to obtain the conductive elastic pads.

EXAMPLE 6
(For Temporary Connection)

A soft polymer matrix with PZT particles embedded is used as the recording medium. The source electrodes of the MOSFETs on the circuitry part are extruding a little out of the surface. Electrical connection will be made by pressing the circuitry part on the record medium part.

EXAMPLE 7
(For Temporary Connection)

Same as example 6, except the substrate of the record medium part is flexible and tape-shaped. As shown in FIG. 3 and discussed in the fifth paragraph on page 5, this tape is wound on two reels. A portion of the tape between the two reels is sandwiched between the circuitry part and a flat plate. Rolling of the reels is monitored to select a required portion of the tape to be read or written. During reading/writing, the selected portion of the tape would be pinched tightly by the circuitry part and the flat plate.

In the above embodiments, bit lines as well as word lines are fabricated on the circuitry part. A variation of this arrangement is to have bit lines fabricated on the record medium part, leaving only word lines on circuitry part. For this, we can use an insulating substrate for the record medium part and divide the metal film on it into strips, perpendicular to the word lines and forming bit lines. We can let all the drain electrodes in circuitry part be connected together so that there are no bit lines on the circuitry part. In the address accessing process, we select one word line in circuitry part and one bit line in the record medium part. In this way, the manufacturing process of circuitry part will be easier. However, if we don't want electrical connection leads to come out directly from the record medium part, each bit line of the record medium part should be connected to a connecting point in the circuitry part, by means of a pair of conductive pads, one in circuitry part and one in the record medium part. In this case, an alignment between the two parts is necessary.

Other than bit lines, we can have other circuitry and/or other devices on the record medium part also, instead of putting them on the circuitry part. Usually, an alignment between the two parts is necessary, in case that both parts have complicated structures.

In the description above, the number of transistors per unit memory cell is assumed to be one. This is the simplest case. However, there are cases using more than one transistor per unit memory cell. For example, the product FM 1208 of Ramtron Corp. is a 512×8 bit SRAM ferroelectric memory, utilizing several transistors per unit cell. It is obvious that even in such cases, the device can still be divided into two parts, just separating off the data recording element in one cell from the other part of the cell and putting them on another substrate. As before, the record medium part will consist of the data-recording medium. The circuitry part will consist of an array of groups of transistors, each group serving the purpose of selecting one address for data writing or reading. The conductive pads in the circuitry part (usually, these pads are connected to source electrodes or drain electrodes of MOSFETs) face upward on the surface and will be pressed on the record medium part. Both word lines and bit lines can all put in circuitry part, or word lines are put in the circuitry part and bit lines be put in the record medium part.

Moreover, the circuitry part can be made of GaAs material instead of Si, with GaAsFET in place of silicon MOSFET. (See for example, L. D. McMillan, SBIR report to Defense Nuclear Agency (1989)). In fact, a good field effect transistor (FET) will function well as an address selector, whether it is a MOSFET or a GaAsFET. The circuitry part can consist of bipolar transistors also, instead of the FETs.

At this point, we would like to point out; separating the whole device into three or more parts is also feasible. For example, We can put a supporting circuitry into a part C. This part C can be laid side by side with the record medium part, with their relative position fix by some means (For example, part C is fabricated on the same substrate as the record medium part, or part C and the record medium part are both bonded to a printed circuit board.). Then this part C and the record medium part are both pressed by the circuitry part.

Some variations of the above descriptions are obvious. For example, in the MOS technology, source electrode is interchangeable with drain electrode; n-type is interchangeable with p-type. Methods of alignment and cleanness keeping can have variations. Nevertheless, the principle of fabricating a complex IC in two parts and making the electrical connections between them afterwards is unique. This principle can be applied to an IC that can be advantageously fabricated of two parts. These two parts do not necessarily consist of silicon and ferroelectrics. For example, one part could be made from silicon substrate and the other part could be made of GaAs substrate. Moreover, at least for the case of permanent connection, the elastomer material used in fabricating the mechanical yieldable, electrically conductive pads can be substituted by any plastic material that can yield on being pressed. Therefore, the foregoing description should be taken as illustrative and not in a limiting sense.

I claim:

1. A ferroelectric memory device comprising two parts where the first part comprises an array of transistors fabricated on a semiconductor substrate and an array of conductive pads protruding from the surface of said first part, where the second part comprises a ferroelectric layer deposited on a separate substrate and where said both parts are fabricated separately and then connected together with all said conductive pads of said first part pressing on said ferroelectric layer of said second part.

2. A ferroelectric memory device as claim 1 where said conductive pads of said first part consist of a first material having a mechanical property such that said second material can yield on being pressed.

3. A ferroelectric memory device as claim 1 where said ferroelectric layer of said second part consists of a second material having a mechanical property such that said second said material can yield on being pressed.

4. A ferroelectric memory device comprising two parts where the first part comprises an array of transistors fabricated on a semiconductor substrate and a first array of conductive pads protruding from the surface of said first part, where the second part comprises a ferroelectric layer deposited on a separate substrate and a second array of conductive pads on top of said ferroelectric layer and where said both parts are fabricated separately and then connected together with every one said conductive pad of said first array pressing on one and only one said conductive pad of said ferroelectric layer of said second array.

5. A ferroelectric memory device as claim 4, where said conductive pads of said first array consist of a first material having a mechanical property such that said first material can yield on being pressed.

6. A ferroelectric memory device as claim 4, where said conductive pads of said second array consist of a second material having a mechanical property such that said second material can yield on being pressed.

7. A ferroelectric memory device as claim 4, where the first material of said first array of conductive pads and the second material of said second array of conductive pads have a eutectic point lower than 550° C. and where after pressing said first array of conductive pads on said second array of conductive pads the temperature of said both parts is raised to higher than said eutectic point of said first material and said second material, but not exceeding 550° C.

* * * * *